(12) United States Patent
Lee et al.

(10) Patent No.: US 9,337,445 B2
(45) Date of Patent: May 10, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Jae-Sun Lee, Yongin (KR); Ung-Soo Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 24 days.

(21) Appl. No.: 14/254,616

(22) Filed: Apr. 16, 2014

(65) Prior Publication Data

US 2015/0035431 A1    Feb. 5, 2015

(30) Foreign Application Priority Data

Aug. 5, 2013 (KR) ................. 10-2013-0092653

(51) Int. Cl.
*H01L 51/52* (2006.01)
*H01L 51/56* (2006.01)

(52) U.S. Cl.
CPC ........ *H01L 51/5256* (2013.01); *H01L 51/5253* (2013.01); *H01L 51/56* (2013.01); *B32B 2457/206* (2013.01)

(58) Field of Classification Search
CPC .................................. H01L 51/5253–51/5256
See application file for complete search history.

(56) References Cited

U.S. PATENT DOCUMENTS

| | | | |
|---|---|---|---|
| 7,722,929 B2 | 5/2010 | Aitken et al. | |
| 2006/0061272 A1* | 3/2006 | McCormick et al. | 313/512 |
| 2006/0170341 A1* | 8/2006 | Su et al. | 313/512 |
| 2007/0040501 A1 | 2/2007 | Aitken et al. | |
| 2007/0252526 A1* | 11/2007 | Aitken et al. | 313/512 |
| 2011/0114992 A1* | 5/2011 | Schmid et al. | 257/100 |
| 2013/0126932 A1* | 5/2013 | Chen et al. | 257/99 |

OTHER PUBLICATIONS

Polishchuk et al; "Oxyfluoride Glasses (A Review)"; ISSN 1087-6596, Glass Physics and Chemistry, 2011, vol. 37, No. 1, pp. 1-20; 2011.

* cited by examiner

*Primary Examiner* — Mariceli Santiago
(74) *Attorney, Agent, or Firm* — Innovation Counsel LLP

(57) ABSTRACT

Provided is an organic light-emitting display apparatus. The organic light-emitting display apparatus includes a substrate, an organic light-emitting unit formed on the substrate and including a stacked structure of a first electrode, an intermediate layer, and a second electrode, an organic layer formed on the organic light-emitting unit, a first adhesion promoting layer formed on the organic layer, and a first inorganic layer formed on the adhesion promoting layer and including a low temperature viscosity transition (LVT) inorganic material.

19 Claims, 3 Drawing Sheets

ORGANIC LIGHT-EMITTING DISPLAY APPARATUS AND METHOD OF MANUFACTURING THE SAME

RELATED APPLICATIONS

This application claims the benefit of Korean Patent Application No. 10-2013-0092653, filed on Aug. 5, 2013, in the Korean Intellectual Property Office, the disclosure of which is incorporated herein in its entirety by reference.

BACKGROUND

1. Field

The present disclosure relates to an organic light-emitting display apparatus and a method of manufacturing the same.

2. Description of the Related Art

An organic light-emitting display apparatus is a light-emitting apparatus having large viewing angles, good contrast, rapid response time, good luminance, and good properties concerning a driving voltage and a response. In addition, a polychromatic display is possible.

The organic light-emitting display apparatus may include an organic light-emitting unit including a lower electrode, an organic layer, and an upper electrode. Since the organic light-emitting unit is weak with respect to an external environment such as oxygen, moisture, and the like, an encapsulating structure encapsulating the organic light-emitting unit from the external environment is necessary.

In addition, developments of a flat panel organic light-emitting apparatus and/or a flexible organic light-emitting apparatus are also needed.

SUMMARY

An organic light-emitting display apparatus including a stable thin film encapsulation structure, and a method of manufacturing the same are provided.

Additional aspects will be set forth in part in the description which follows and, in part, will be apparent from the description, or may be learned by practice of the presented embodiments.

In one aspect, an organic light-emitting display apparatus includes a substrate, an organic light-emitting unit formed on the substrate and including a stacked structure of a first electrode, an intermediate layer, and a second electrode, an organic layer formed on the organic light-emitting unit, a first adhesion promoting layer formed on the organic layer, and a first inorganic layer formed on the first adhesion promoting layer and including a low temperature viscosity transition (LVT) inorganic material.

The first adhesion promoting layer may include at least one of a metal oxide and an organometallic compound.

The organic layer may be also formed on the substrate.

The LVT inorganic material may include tin oxide.

The first adhesion promoting layer and the first inorganic layer may also be formed on the substrate.

The substrate may be a flexible substrate.

The organic light-emitting display apparatus may further include a second adhesion promoting layer formed on the first inorganic layer, and a second inorganic layer formed on the second adhesion promoting layer and including the LVT inorganic material.

The second adhesion promoting layer and the second inorganic layer may also be formed on the substrate.

The organic light-emitting display apparatus may further include an encapsulation substrate on the second inorganic layer.

According to another aspect, a method of manufacturing an organic light-emitting display apparatus includes forming an organic light-emitting unit including a stacked structure of a first electrode, an intermediate layer, and a second electrode on a substrate, forming an organic layer on the organic light-emitting unit, forming a first adhesion promoting layer including at least one of a metal oxide and an organometallic compound on the organic layer, and forming a first inorganic layer including a low temperature viscosity transition (LVT) inorganic material on the first adhesion promoting layer.

The forming of the first inorganic layer may further include providing the LVT inorganic material on the first adhesion promoting layer to form a first pre-inorganic layer including the LVT inorganic material, and curing the first pre-inorganic layer at a temperature above a viscosity transition temperature of the LVT inorganic material.

The organic layer may also be formed on the substrate.

The first adhesion promoting layer and the first inorganic layer may also be formed on the substrate.

The method may further include forming a second adhesion promoting layer including at least one of a metal oxide and an organometallic compound on the first inorganic layer, and forming a second inorganic layer including the LVT inorganic material on the second adhesion promoting layer.

The method may further include forming an encapsulation substrate on the second inorganic layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
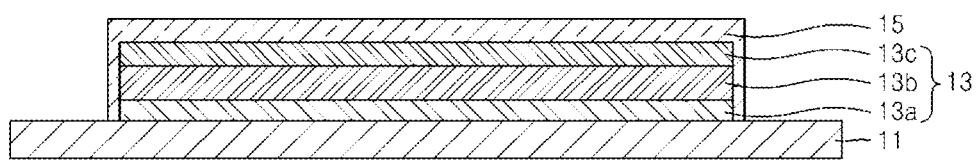
FIGS. 1 to 3 are schematic diagrams illustrating a method of manufacturing an organic light-emitting display apparatus subsequently, in accordance with an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

Hereinafter, the constitution and the function will be described in detail referring to example embodiments illustrated in the attached drawings.

Sizes of elements in the drawings may be exaggerated for convenience of explanation. In other words, because sizes and thicknesses of components in the drawings are arbitrarily illustrated for convenience of explanation, the following embodiments are not limited thereto.

It will be understood that although the terms "first", "second", etc. may be used herein to describe various components, these components should not be limited by these terms. These components are only used to distinguish one component from another. It will be understood that when a layer, region, or component is referred to as being "formed on," another layer, region, or component, it can be directly or indirectly formed on the other layer, region, or component. That is, for example, intervening layers, regions, or components may be present.

Figure 2:
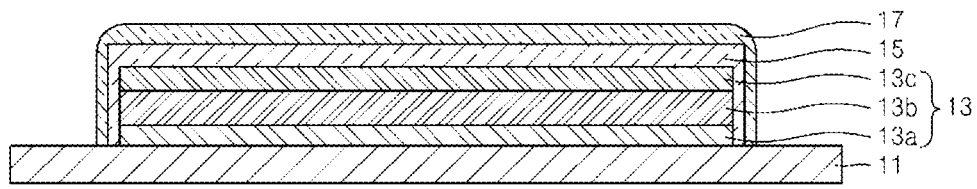
Figure 3:
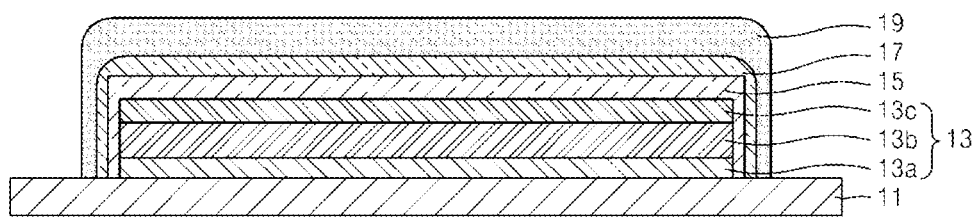

FIGS. 1 to 3 are schematic diagrams illustrating a method of manufacturing an organic light-emitting display apparatus in accordance with an example embodiment.

First, a substrate 11 is prepared. The substrate 11 may be a substrate used in a common organic light-emitting display apparatus. The substrate 11 may be formed by using a material having good mechanical strength, thermal stability, surface smoothness, easy handling properties, and water-resistance.

The substrate 11 may be formed by using a rigid material, and may be, for example, one of a glass substrate, a plastic substrate, a metal substrate, and a carbon fiber substrate. When the organic light-emitting display apparatus is a flexible display apparatus, the substrate 11 may be formed by using a flexible material, and may be, for example, one of a polyimide (PI) substrate and a polyethylene terephthalate (PET) substrate.

An organic light-emitting unit 13 is formed on the substrate 11. The organic light-emitting unit 13 has a stacked structure of a first electrode 13a, an intermediate layer 13b, and a second electrode 13c on the substrate 11.

The first electrode 13a may be formed by providing a first electrode-forming material on the substrate 11 by a deposition method or a sputtering method. When the first electrode 13a is an anode, a lower electrode-forming material may be selected from materials having a high work function for easy hole injection. Based on the type of the organic light-emitting display apparatus to be formed, the first electrode 13a may be a reflection type electrode, a semi-transparent type electrode, or a transparent type electrode. The first electrode-forming material may include transparent and conductive materials such as, for example, indium tin oxide (ITO), indium zinc oxide (IZO), tin oxide ($SnO_2$), zinc oxide (ZnO), and the like. The first electrode 13a may be formed as the reflection type electrode when using, for example, magnesium (Mg), aluminum (Al), aluminum-lithium (Al—Li), calcium (Ca), magnesium-indium (Mg—In), magnesium-silver (Mg—Ag), and the like.

The first electrode 13a may have a single layer structure or a multi-layer structure of two or more layers. For example, the first electrode 13a may have a three-layer structure of ITO/Ag/ITO to obtain a top emission type light-emitting apparatus. However, the present invention is not limited thereto.

On the first electrode 13a, the intermediate layer 13b is provided.

The intermediate layer 13b may include at least one layer among a hole injecting layer, a hole transporting layer, a functional layer having a hole injecting function and a hole transporting function at the same time, a buffer layer, an electron stopping layer, a light-emitting layer, a hole stopping layer, an electron transporting layer, and an electron-injecting layer.

In the intermediate layer 13b, for example, at least one of the following compounds 301, 311, and 321 may be included:

[Chemical Formula 1]

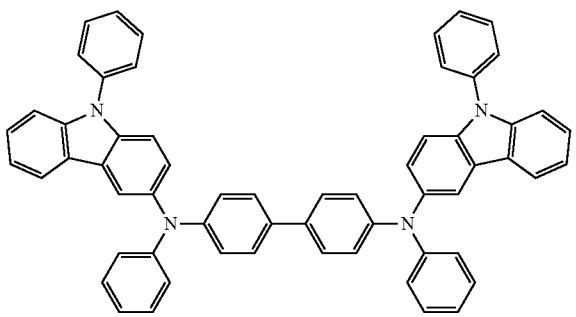

301

[Chemical Formula 2]

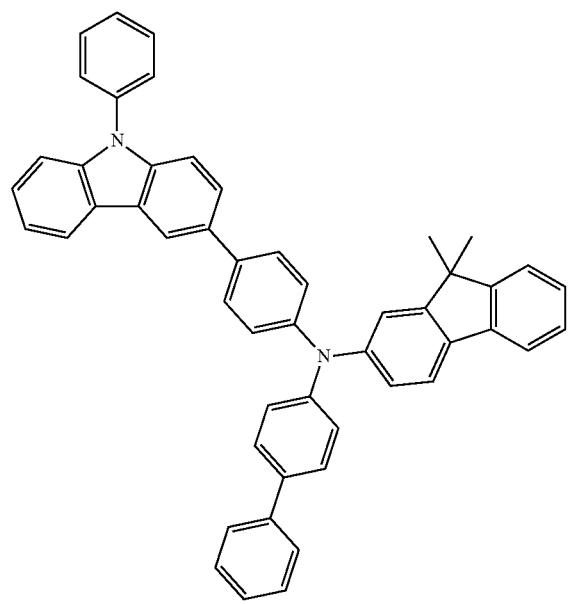

311

[Chemical Formula 3]

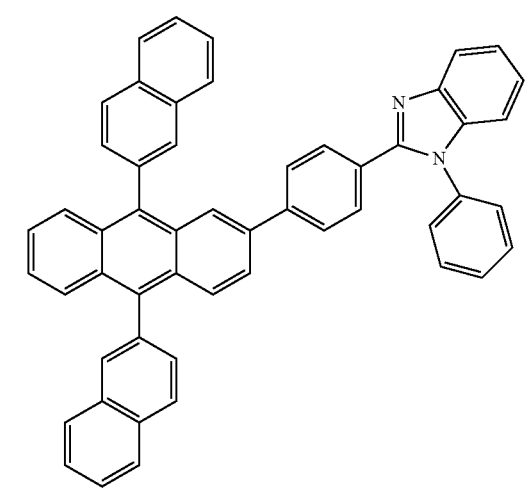

321

On the intermediate layer 13b, the second electrode 13c is provided. The second electrode 13c may be a cathode, which is an electron-injecting electrode. In this case, second electrode-forming materials may include a metal, an alloy, an electrically conductive compound, and a mixture thereof having a low work function. Particularly, a thin film may be formed using, for example, lithium (Li), magnesium (Mg), aluminum (Al), aluminum-lithium (Al—Li), calcium (Ca), magnesium-indium (Mg—In), magnesium-silver (Mg—Ag), or the like, and may be used as a reflection type, a semi-transparent type, or a transparent type electrode. Various modifications may be applied. For example, a transparent type electrode may be formed by using ITO or IZO to obtain a top emission type light-emitting apparatus.

Even though not illustrated in FIG. 1, the organic light-emitting unit 13 includes one pixel circuit for one pixel. The pixel circuit may include at least one thin film transistor (not illustrated) and a capacitor (not illustrated). The first electrode 13a may be electrically connected to the thin film transistor and may be driven.

The first electrode 13a may be patterned separately with respect to each pixel, and the second electrode 13c may be formed as a common electrode to cover all pixels.

In a bottom emission type light-emitting apparatus, in which an image is embodied in the direction of the substrate 11 (i.e., light producing the image is directed toward the substrate 11), the thickness of the second electrode 13c may be relatively large so as to increase light-emitting efficiency in the direction of the substrate 11.

In a top emission type light-emitting apparatus, in which an image is embodied in the direction of the second electrode 13c (i.e., light producing the image is directed toward the second electrode 13c), the thickness of the second electrode 13c may be relatively small. In this case, the second electrode 13c may be a semi-transparent type reflection layer, or the second electrode 13c may be formed by using a transparent conductive material in addition to the above-described materials. The first electrode 13a may further include a reflection layer.

On the second electrode 13c, an organic layer 15 is formed. The organic layer 15 may be a passivation layer that prevents damage to the second electrode 13c while forming a thin film encapsulation structure on the organic light-emitting unit 13.

When the organic light-emitting unit 13 is the top emission type emitting light in the direction of the second electrode 13c, the organic layer 15 may be formed by using a transparent material having a high refractive index to perform a refractive index matching. The organic layer 15 may be formed by using, for example, at least one of lithium fluoride (LiF), lithium quinolate (8-hydroxyquinolinolato-lithium, Liq) and tris(8-hydroxy-quinolate)aluminum (Alq$_3$). The organic layer 15 may be formed on the substrate 11 as well as on the organic light-emitting unit 13. The organic layer 15 may be formed as a uniform film to encapsulate the whole organic light-emitting unit 13.

The organic layer 15 may be formed by using a resistance heating deposition method, a sputtering method, a vacuum deposition method, a low temperature deposition method, an electron beam coating method, or an ion plating method. In the resistance heating deposition method, heat created by an electrical resistance is applied to a source to vaporize the source and to deposit the source on a target. In the sputtering method, a thin film may be formed through a sputtering process. The other methods are known, and detailed description thereof is omitted.

A thin film encapsulation structure is formed on the organic layer 15 covering the organic light-emitting unit 13, as illustrated in FIGS. 2 and 3. The thin film encapsulation structure in accordance with an example embodiment has a stacked structure of an adhesion promoting layer 17 and an inorganic layer 19.

Referring to FIGS. 2 and 3, the adhesion promoting layer 17 is formed on the organic layer 15.

The adhesion promoting layer 17 promotes the adhesion of the organic layer 15 and the inorganic layer 19. The organic layer 15 includes an organic material, and the adhesion between the organic layer 15 and the inorganic layer 19 may be an organic-inorganic adhesion. Thus, the adhesiveness of the organic-inorganic adhesion may be weaker than an inorganic-inorganic adhesion.

Thus, the adhesion promoting layer 17 is disposed between the organic layer 15 and the inorganic layer 19 to reinforce the adhesion between the organic layer 15 and the inorganic layer 19 and to obtain a strong thin film encapsulation structure. The adhesion promoting layer 17 may include at least one of a metal oxide and an organometallic compound.

The metal oxide may include, for example, $Al_2O_3$, $SiO_2$, $Si_xN_y$, Zinc Tin Oxide (composition including increased tin and oxide ratios to eliminate conductivity), and the like. The organometallic compound may be, for example, a mononuclear metal carbonyl compound $[M(Co)_x]$ or a polynuclear metal carbonyl compound $[M_x(CO)_y]$. The mononuclear metal carbonyl compound may include, for example, $Mo(CO)_5$, $Fe(CO)_5$, $Cr(CO)_6$, $W(CO)_6$, and the like. The polynuclear metal carbonyl compound may include, for example, $Mn_2(CO)_{10}$, $Co_2(CO)_8$, $Fe_2(CO)_9$, and the like. However, the present invention is not limited thereto.

The adhesion promoting layer 17 may be formed as a single layer or include multiple layers that include the above-described materials.

The adhesion promoting layer 17 may be formed on the substrate 11 as well as on the organic layer 15. The adhesion promoting layer 17 may be formed as a uniform layer covering the whole organic light-emitting unit 13. With this, the organic light-emitting unit 13 and the organic layer 15 may be encapsulated tightly by the adhesion promoting layer 17.

The adhesion promoting layer 17 may be formed by using a resistance heating deposition method, a sputtering method, a vacuum deposition method, a low temperature deposition method, an electron beam coating method, or an ion plating method.

Referring to FIG. 3, the inorganic layer 19 may be formed on the adhesion promoting layer 17. The inorganic layer 19 may include, for example, a low temperature viscosity transition (LVT) inorganic material. Hereinafter, the process of forming of the inorganic layer 19 will be described in detail.

First, an LVT inorganic material is provided on the adhesion promoting layer 17 to form a pre-inorganic layer (not illustrated) including the LVT inorganic material.

The LVT inorganic material is an inorganic material having a low viscosity transition temperature.

As used herein, the "viscosity transition temperature" does not mean a temperature inducing a complete change from a "solid state" to a "liquid state" of the LVT inorganic material, but means the lowest temperature at which fluidity of the LVT inorganic material may be obtained.

The viscosity transition temperature of the LVT inorganic material may be lower than the transforming temperature of a material included in the organic light-emitting unit 13.

The "transforming temperature of the material included in the organic light-emitting unit" means a temperature that may induce chemical and/or physical transformation of the material included in the organic light-emitting unit. For example, the "transforming temperature of the material included in the organic light-emitting unit" may mean a glass transition temperature (Tg) of an organic material included in the intermediate layer 13b of the organic light-emitting unit 13. The Tg of the material included in the organic light-emitting unit 13 may be obtained from a thermal analysis using thermo gravimetric analysis (TGA) and differential scanning calorimetry (DSC) ($N_2$ atmosphere, temperature range: from room temperature to about 600° C. (10° C./min)-TGA, from room temperature to about 400° C.-DSC, Pan type: Pt pan in disposable Al pan-TGA, in disposable Al pan-DSC). The process would be understood by a person of ordinary skill in the art.

The transforming temperature of the material included in the organic light emitting unit 13 may exceed, for example, about 130° C.; however, it is not limited thereto. The transforming temperature of the material included in the organic light-emitting unit 13 may be easily measured through the TGA described above.

The viscosity transition temperature of the LVT inorganic material may be about 80° C. or above, for example, about 80° C. to about 130° C., and is not limited thereto. For example, the viscosity transition temperature of the LVT inorganic material may be, about 80° C. to about 120° C., or about 100° C. to about 120° C. and is not limited thereto.

The LVT inorganic material may include a single compound or a mixture of two or more compounds.

The LVT inorganic material may include, for example, tin oxide (for example, SnO or $SnO_2$).

When the LVT inorganic material includes SnO, the amount of SnO may be from about 20 wt % to about 100 wt %.

The LVT inorganic material may include, for example, at least one of phosphor oxide (for example, $P_2O_5$), boron phosphate ($BPO_4$), tin fluoride (for example, $SnF_2$), niobium oxide (for example, NbO), and tungsten oxide (for example, $WO_3$), and is not limited thereto.

The LVT inorganic material may include, for example, the following compounds and is not limited thereto:
SnO;
SnO and $P_2O_5$;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$;

The LVT inorganic material may include, for example, the following compounds and is not limited thereto:
1) SnO (about 100 wt %);
2) SnO (about 80 wt %) and $P_2O_5$ (about 20 wt %);
3) SnO (about 90 wt %) and $BPO_4$ (about 10 wt %);
4) SnO (about 20-50 wt %), $SnF_2$ (about 30-60 wt %), and $P_2O_5$ (about 10-30 wt %) (where the sum of SnO, $SnF_2$, and $P_2O_5$ is about 100 wt %);
5) SnO (about 20-50 wt %), $SnF_2$ (about 30-60 wt %), $P_2O_5$ (about 10-30 wt %), and NbO (about 1-5 wt %) (where the sum of SnO, $SnF_2$, $P_2O_5$, and NbO is about 100 wt %); or
6) SnO (about 20-50 wt %), $SnF_2$ (about 30-60 wt %), $P_2O_5$ (about 10-30 wt %), and $WO_3$ (about 1-5 wt %) (where the sum of SnO, $SnF_2$, $P_2O_5$, and $WO_3$ is about 100 wt %)

For example, the LVT inorganic material may include SnO (about 42.5 wt %), $SnF_2$ (about 40 wt %), $P_2O_5$ (about 15 wt %), and $WO_3$ (about 2.5 wt %) and is not limited thereto.

The pre-inorganic layer including the LVT material may be formed by using a resistance heating deposition method, a sputtering method, a vacuum deposition method, a low temperature deposition method, an electron beam coating method, or an ion plating method.

The LVT inorganic material may be provided by a plasma-enhanced chemical vapor deposition (PECVD) method or a plasma ion assisted deposition (PIAD) method. However, the method is not limited thereto.

In accordance with an example embodiment, an LVT inorganic material having $SnO$—$SnF_2$—$P_2O_5$—$WO_3$ composition may be provided on the adhesion promoting layer 17 by a sputtering method. In the sputtering method, a dual rotary target method or a facing target method using a DC pulse power source may be applied, and a scanning method while moving the substrate 11 may be used. In this case, argon plasma of about 4 kW to about 20 kW and of about 0.3 Pa to about 1.5 Pa may be used. The pre-inorganic layer (not illustrated) having a desired thickness (for example, about 1 µm) may be obtained by repeating the scanning.

The pre-inorganic layer may include defects such as a layer factor and a pin hole. The "layer factor" of the LVT inorganic material layer means coagulated particles of the LVT inorganic material that did not participate in the formation of a layer, and the "pin hole" means a region exposing the organic layer 15, in which the LVT inorganic material is not provided.

The above-described defects of the pre-inorganic layer may allow a passage of environmental materials such as moisture, oxygen, or the like while storing and driving the organic light-emitting apparatus, and may be a factor in forming a progressive dark spot, thereby decreasing the lifetime of the organic light-emitting apparatus.

Thus, after forming the pre-inorganic layer, a curing process for removing defects of the pre-inorganic layer may be conducted.

The curing process may be conducted at a temperature that is higher than the viscosity transition temperature of the LVT inorganic material. For example, the curing process may be conducted by heat treating the pre-inorganic layer at a temperature range from the viscosity transition temperature of the LVT inorganic material to the transforming temperature of the material included in the organic light-emitting unit 13. The "viscosity transition temperature of the LVT inorganic material" may be dependent on the composition of the LVT inorganic material, and the "transforming temperature of the material included in the organic light-emitting unit" may be dependent on the material used in the organic light-emitting unit 13. The "viscosity transition temperature of the LVT inorganic material" and the "transforming temperature of the material included in the organic light-emitting unit" may be easily recognized by a person of ordinary skill in the art based on the composition of the LVT inorganic material and the material used in the organic light-emitting unit 13 (for example, Tg may be evaluated from the TGA analysis result on the material included in the organic light-emitting unit 13).

The curing process may be conducted by heat treating the pre-inorganic layer at from about 80° C. to about 130° C. for about 1 to about 3 hours (for example, at about 110° C. for 2 hours), and is not limited thereto. When the temperature for the curing process satisfies the above-described range, the pre-inorganic layer of the LVT inorganic material may be fluidized, and the transformation of the organic light-emitting unit 13 may be prevented.

The curing process may be conducted in an IR oven in vacuum or an inert gas atmosphere (for example, $N_2$ atmosphere, Ar atmosphere, etc.) to prevent exposure of the organic light-emitting unit 13 to the external environment through a pin hole of the pre-inorganic layer.

Through the curing process, the LVT inorganic material included in the pre-inorganic layer may be fluidized. The fluidized LVT inorganic material may have flowability, that is, the ability to flow. Thus, the fluidized LVT inorganic material may flow to fill up any pin holes in the pre-inorganic layer, and any layer factors may be fluidized, and such fluidized layer factors may flow to fill up the pin hole, and thus the LVT inorganic material forming the layer has a uniform consistency across the layer.

Then, the defects of the pre-inorganic layer may be eliminated and a dense inorganic layer 19 may be formed.

The thickness of the inorganic layer 19 may be from about 1 μm to about 30 μm, for example, from about 1 μm to about 5 μm. When the thickness of the inorganic layer 19 is in the range from about 1 μm to about 5 μm, a flexible organic light-emitting apparatus having bending properties may be manufactured.

The inorganic layer 19 may be formed as the thin film as described above, and a flexible organic light-emitting apparatus having bending properties may be manufactured. Accordingly, an organic light-emitting apparatus having a long lifetime and flexibility may be obtained.

Figure 4:
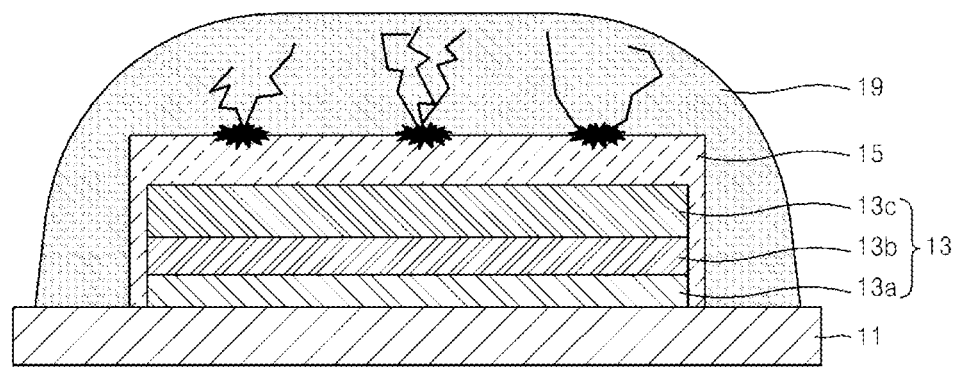
FIGS. 4 and 5 are schematic diagrams illustrating Comparative Examples for explaining an effect of an organic light-emitting display apparatus in accordance with an example embodiment.
Figure 5:
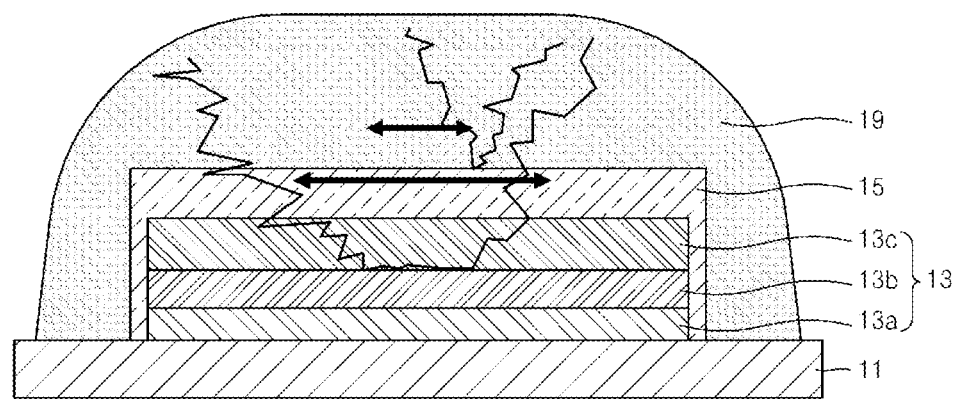

FIGS. 4 and 5 are schematic diagrams illustrating Comparative Examples for explaining an effect of an organic light-emitting display apparatus in accordance with an example embodiment.

In FIGS. 4 and 5, an inorganic layer 19 is formed on the organic layer 15 covering the organic light-emitting unit 13. That is, a thin film encapsulation structure may be formed only using the inorganic layer 19 on the organic layer 15 covering organic light-emitting unit 13, without the adhesion promoting layer. In the structure in which the inorganic layer 19 and the organic layer 15 contact, there may be a weak adhesiveness due to the difference of the materials of the inorganic layer 19 and the organic layer 15. In addition, the inorganic layer 19 and the organic layer 15 have different coefficients of thermal expansion (CTE). Due to stress generated by different expansion degrees between the inorganic layer 19 and the organic layer 15 due to heat generated in the organic light-emitting unit 13 and environmental temperature change, interfacial delamination at the interface of the inorganic layer 19 and the organic layer 15 may be generated, or defects such as cracks in the dense inorganic layer 19 may be generated, as illustrated in FIG. 4. In this case, moisture and oxygen may penetrate in the organic light-emitting unit 13, and the organic light-emitting unit 13 (OLED) may deteriorate. Accordingly, light-emitting properties may be lowered, dark spots may be formed in the organic light-emitting display apparatus, and pixel shrinkage may occur.

In accordance with an example embodiment as in FIG. 3, an adhesion promoting layer 17 is disposed between the organic layer 15 and the inorganic layer 19, and thus, the above-described defects may be solved. Because the adhesion promoting layer 17 is formed by using, for example, a mononuclear metal carbonyl compound [M(CO)$_x$] or a polynuclear metal carbonyl compound [M$_x$(CO)$_y$], stress between the organic layer 15 and the inorganic layer 19, which is the most serious factor of the defects of the inorganic layer 19, may be markedly decreased.

Figure 6:
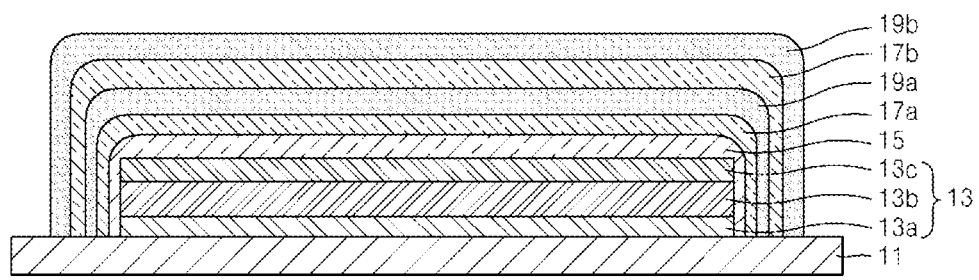
FIG. 6 is a schematic diagram illustrating a method of manufacturing an organic light-emitting display apparatus, in accordance with another example embodiment.

FIG. 6 is a schematic diagram illustrating a method of manufacturing an organic light-emitting display apparatus, in accordance with another example embodiment. Since constituting elements corresponding to those in the example embodiment in FIG. 3 have substantially the same functions, detailed description thereof is omitted.

According to the example embodiment in FIG. 6, first and second adhesion promoting layers 17a and 17b and first and second inorganic layers 19a and 19b are subsequently formed as a multi-layer structure, respectively, compared with the example embodiment in FIG. 3, in which each of the adhesion promoting layer and the inorganic layer is formed as a single layer.

Generally, the stress of a layer is proportional to the thickness of the layer. To decrease the stress of the layer in FIG. 6, an inorganic layer is obtained by stacking the first and second inorganic layers 19a and 19b. To decrease the stress of the layer between the first and second inorganic layers 19a and 19b, the second adhesion promoting layer 17b may be formed between the first and second inorganic layers 19a and 19b. The adhesion promoting layer formed on the organic layer 15 is the first adhesion promoting layer 17a.

Particularly, the second adhesion promoting layer 17b is formed on the first inorganic layer 19a in FIG. 6. The method of forming the second adhesion promoting layer 17b, the materials for forming the second adhesion promoting layer 17b, and the shape of the second adhesion promoting layer 17b may be substantially the same as those of the adhesion promoting layer 17 described with reference to FIGS. 1 to 3, and repeated description thereof is omitted.

Then, the second inorganic layer 19b is formed on the second adhesion promoting layer 17b. The method of forming the second inorganic layer 19b, the materials for forming the second inorganic layer 19b, and the shape of the second inorganic layer 19b may be substantially the same as those of the inorganic layer 19 described above with respect to FIGS. 1 to 3, and repeated description thereof is omitted.

In the example embodiment in FIG. 6, the thickness of the first and second inorganic layers 19a and 19b is smaller than the thickness of the inorganic layer 19 in FIG. 3. The thickness of the inorganic layer 19 in FIG. 3 may be from about 1 μm to about 30 μm, for example, from about 1 μm to about 5 μm. The thickness of the first inorganic layer 19a in FIG. 6 may be about 1 μm or less, and the thickness of the second inorganic layer 19b may also be about 1 μm or less. That is, one inorganic layer having a thickness from about 1 μm to about 5 μm is formed, as shown in FIG. 3; however, a plurality of inorganic layers having a thickness of about 1 μm or less are formed, as shown in FIG. 6. Through repeatedly forming the thin inorganic layers, the stress of the layer may be decreased, and the encapsulating properties of the thin film encapsulation structure may be improved.

In FIG. 6, two inorganic layers are formed as an example embodiment. However, three or more inorganic layers may be formed. In this case, an elastic layer for decreasing the stress between the inorganic layers may be disposed between the additional inorganic layers.

Figure 7:
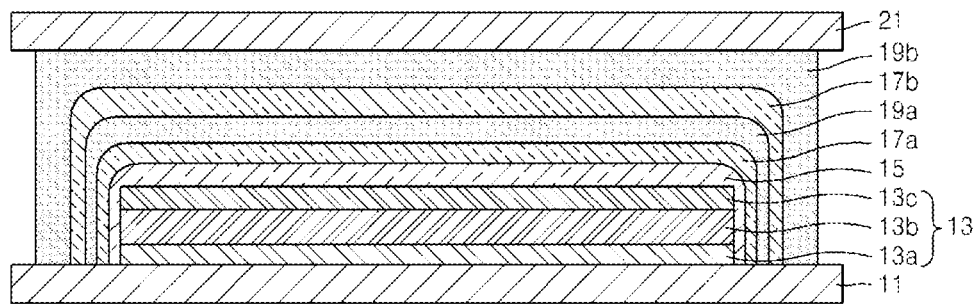
FIG. 7 is a schematic diagram illustrating a method of manufacturing an organic light-emitting display apparatus, in accordance with another example embodiment.

FIG. 7 is a schematic diagram illustrating a method of manufacturing an organic light-emitting display apparatus, in accordance with another example embodiment.

According to the example embodiment in FIG. 7, an encapsulation substrate 21 is further formed at the outermost position on an inorganic layer, compared with the example embodiment in FIG. 6. The constitution elements in FIG. 7 corresponding to those in FIG. 6 have substantially the same functions as explained in FIG. 6, and detailed description thereof is omitted.

The encapsulation substrate 21 is disposed at the outermost position of the thin film encapsulation structure to stabilize the thin film encapsulation structure, and the organic light-emitting display apparatus may be passivated from external impact. The encapsulation substrate 21 may be formed by using the same material as the substrate 11. When the organic light-emitting display apparatus is a top emission type, in which light is emitted in the direction of the second electrode 13c, the encapsulation substrate may be formed as a transparent substrate transmitting light.

The encapsulation substrate 21 is disposed on the outermost inorganic layer. In FIG. 7, the encapsulation substrate 21 is disposed on the second inorganic layer 19b of the thin film encapsulation structure in FIG. 6 as an example embodiment. However, the present invention is not limited thereto.

In an example embodiment, the encapsulation substrate may be further formed on the inorganic layer of the encapsulation structure in FIG. 3, or on the second inorganic layer of the encapsulation structure in FIG. 6. Another structure that is obtained by combining the examples of the present disclosure may further include the encapsulation substrate at the outermost position on the inorganic layer.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure, including the following claims.

What is claimed is:

1. An organic light-emitting display apparatus comprising:
    a substrate;
    an organic light-emitting unit formed on the substrate and including a stacked structure of a first electrode, an intermediate layer, and a second electrode;
    an organic layer formed on the organic light-emitting unit;
    a first adhesion promoting layer formed on the organic layer; and
    a first inorganic layer formed on the first adhesion promoting layer and including a low temperature viscosity transition (LVT) inorganic material,
    wherein the first adhesion promoting layer promotes adhesion between the organic layer and the first inorganic layer, and
    wherein the first inorganic layer is formed from a pre-inorganic layer by a heat treatment at a temperature above a viscosity transition temperature of the LVT inorganic material.

2. The organic light-emitting display apparatus of claim 1, wherein the first adhesion promoting layer includes at least one of a metal oxide and an organometallic compound.

3. The organic light-emitting display apparatus of claim 1, wherein the organic layer is also formed on the substrate.

4. The organic light-emitting display apparatus of claim 1, wherein the LVT inorganic material includes tin oxide.

5. The organic light-emitting display apparatus of claim 1, wherein the first adhesion promoting layer and the first inorganic layer are also formed on the substrate.

6. The organic light-emitting display apparatus of claim 1, wherein the substrate is a flexible substrate.

7. The organic light-emitting display apparatus of claim 1, further comprising:
    a second adhesion promoting layer formed on the first inorganic layer; and
    a second inorganic layer formed on the second adhesion promoting layer and including the LVT inorganic material.

8. The organic light-emitting display apparatus of claim 7, wherein the second adhesion promoting layer and the second inorganic layer are also formed on the substrate.

9. The organic light-emitting display apparatus of claim 7, further comprising an encapsulation substrate on the second inorganic layer.

10. The organic light-emitting display apparatus of claim 1,
    wherein the viscosity transition temperature of the LVT inorganic material is lower than a transforming temperature of a material included in the organic light-emitting unit, and
    wherein the viscosity transition temperature is above 80° C. and the transition temperature is below 130° C.

11. The organic light-emitting display apparatus of claim 1, wherein the LVT inorganic material includes at least one of phosphor oxide, boron phosphate, tin fluoride, niobium oxide, and tungsten oxide.

12. A method of manufacturing an organic light-emitting display apparatus, the method comprising:
    forming an organic light-emitting unit including a stacked structure of a first electrode, an intermediate layer, and a second electrode on a substrate;
    forming an organic layer on the organic light-emitting unit;
    forming a first adhesion promoting layer including at least one of a metal oxide and an organometallic compound on the organic layer; and
    forming a first inorganic layer including a low temperature viscosity transition (LVT) inorganic material on the first adhesion promoting layer,
    wherein the first adhesion promoting layer promotes adhesion between the organic layer and the first inorganic layer, and
    wherein the first inorganic layer is formed from a pre-inorganic layer by a heat treatment at a temperature above a viscosity transition temperature of the LVT inorganic material.

13. The method of claim 12, wherein the forming of the first inorganic layer comprises:
    providing the LVT inorganic material on the first adhesion promoting layer to form the pre-inorganic layer including the LVT inorganic material; and
    curing the pre-inorganic layer at the temperature above the viscosity transition temperature of the LVT inorganic material.

14. The method of claim 12, wherein the organic layer is also formed on the substrate.

15. The method of claim 12, wherein the first adhesion promoting layer and the first inorganic layer are also formed on the substrate.

16. The method of claim 12, further comprising:
    forming a second adhesion promoting layer including at least one of a metal oxide and an organometallic compound on the first inorganic layer; and
    forming a second inorganic layer including the LVT inorganic material on the second adhesion promoting layer.

17. The method of claim 16, further comprising forming an encapsulation substrate on the second inorganic layer.

18. The method of claim 12,
    wherein the viscosity transition temperature of the LVT inorganic material is lower than a transforming temperature of a material included in the organic light-emitting unit, and
    wherein the viscosity transition temperature is above 80° C. and the transition temperature is below 130° C.

19. The method of claim 12, wherein the LVT inorganic material includes at least one of phosphor oxide, boron phosphate, tin fluoride, niobium oxide, and tungsten oxide.

* * * * *